United States Patent [19]

Ige

[11] Patent Number: 4,801,875
[45] Date of Patent: Jan. 31, 1989

[54] INTEGRATED CIRCUIT WITH FREQUENCY DIVIDING TEST FUNCTION

[75] Inventor: Yuji Ige, Tokyo, Japan

[73] Assignee: Seikosha Co., Ltd., Tokyo, Japan

[21] Appl. No.: 21,670

[22] Filed: Mar. 4, 1987

[30] Foreign Application Priority Data

Jun. 3, 1986 [JP] Japan ................................ 61-128967

[51] Int. Cl.⁴ ............................................. G01P 21/00
[52] U.S. Cl. ............................. 324/158 R; 324/73 R; 377/28
[58] Field of Search .............................. 377/28, 29, 30; 324/158 R, 158 MG, 73 R; 371/27

*Primary Examiner*—John S. Heyman
*Attorney, Agent, or Firm*—Bruce L. Adams; Van C. Wilks

[57] ABSTRACT

An integrated circuit with a frequency dividing test function includes a first frequency dividing circuit which divides a given frequency signal, a second frequency dividing circuit for dividing the output signal from the first frequency dividing circuit and a single terminal receptive of external test clock pulses. A test circuit is connected to the reset terminal for inhibiting the output signal from the first frequency dividing circuit when the external test clock pulses applied to the reset terminal have a higher frequency than the divided frequency of the first output signal and for applying the external clock pulses to the second frequency dividing circuit to test the second frequency dividing circuit.

3 Claims, 2 Drawing Sheets

INTEGRATED CIRCUIT WITH FREQUENCY DIVIDING TEST FUNCTION

BACKGROUND OF THE INVENTION

1. Field of the Invention

The present invention relates to an integrated circuit with a frequency dividing test function.

2. Description of the Related Art

For example, in an integrated circuit for a crystal clock, high accuracy and reliability are essential. Therefore, it is necessary to test the integrated circuit one by one during manufacture in order to check whether the frequency dividing circuit operates normally or not and the time required for such test has been a large problem.

In a prior art circuit shown in FIG. 4, a test terminal has been provided on an integrated circuit in order to execute this test and the test has been carried out by supplying a high speed external clock pulse for test through gate G to the intermediate stage $D_2$ of the frequency dividing circuit from such terminal and view the outputs $O_1$, $O_2$ of the driver. Since the dividing circuit $D_1$ before such intermediate stage $D_2$ normally receives an oscillator output, it must be halted during the test, and thus a stop terminal must also be provided in addition to said test terminal.

SUMMARY OF THE INVENTION

As described previously, the test and stop terminals have been required in the prior art and this has resulted in an increase in size of the chip and the cost of the integrated circuit.

The present invention eliminates disadvantages of the prior art by providing an integrated circuit with the frequency dividing function which has been realized with providing only one terminal.

DETAILED DESCRIPTION OF THE PREFERRED EMBODIMENTS

Figure 1:
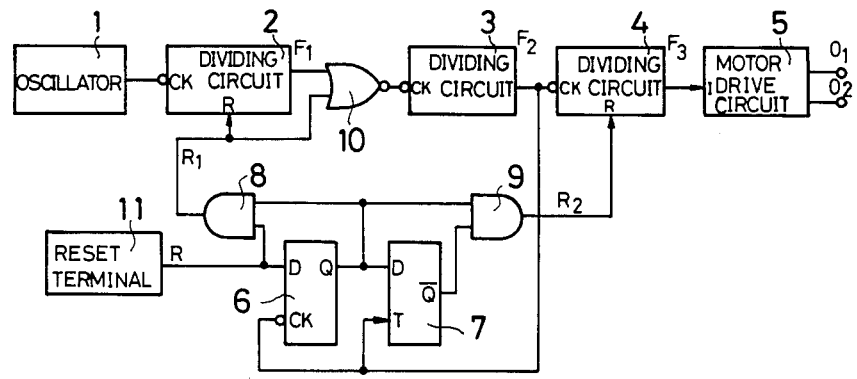
FIG. 1 shows a logical circuit diagram representing an embodiment of the present invention.

In FIG. 1, the reference numeral 1 represents an oscillator; 2, 3, 4, frequency dividing stages which operate at the falling edge of a pulse; 5, a motor drive circuit; 6, 7, flip-flop circuits which operate respectively at the rising and falling edges of a pulse; 8, 9, 10, gate circuits; 11, a reset terminal.

Figure 2:
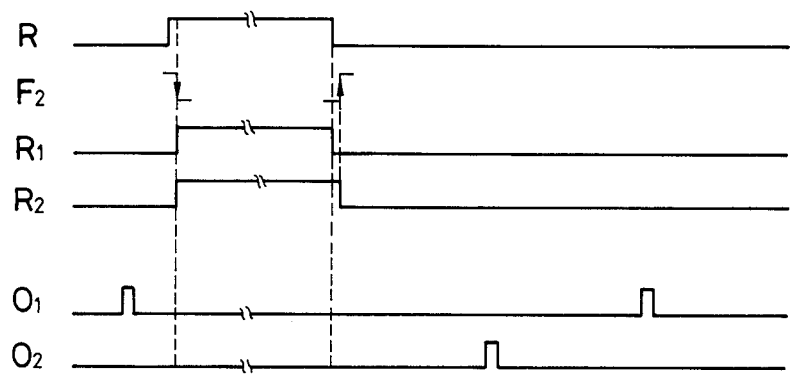
FIG. 2 and FIG. 3 are timecharts for explaining the operations in FIG. 1.

In normal operation mode, the reset terminal 11 is held at "0", therefore the output $R_1$ of the gate circuit 8 is held at "0" and the dividing circuit 2 is kept operative, that is, the output pulses from it pass through the gate circuit 10 and are then supplied to the dividing circuit 3. Output pulses $F_2$ from the driving circuit 3 are supplied to the flip-floP circuits 6 and 7. Output Q of the flip-flop circuit 6 is held "0" because signal R is at "0" and the output $\bar{Q}$ is held "1", since the D input is at "0". Accordingly, the outputs of the gate circuits 8, 9 are at "0", so dividing circuits 2, 4 are kept operative. Motor drive pulses $0_1$, $0_2$ of FIG. 2 are generated from the motor drive circuit 5. The reset operation of the frequency dividing stages is now explained. In this case, the reset terminal 11 is held at "1" as illustrated in FIG. 2R. Thereby, one input of the AND gate circuit 8 and the D input of the flip-flop circuit 6 are set to "1" and soon thereafter the output of the frequency dividing stage 3 falls as shown in $F_2$ of FIG. 2. The output Q of the flip-flop circuit 6 then turns to "1". Since the output $\bar{Q}$ of flip-flop 7 is "1", the outputs of the AND gate circuits 8, 9 are respectively changed to "1" as illustrated in FIGS. 2 $R_{11}$, $R_2$ and thereby the frequency dividing stages 2, 4 are reset.

The dividing stage 3 is therefore held in the reset state where output is all "0".

While the reset terminal 11 is thus held at "1", the frequency dividing stages 2, 3, 4 are held in the reset state.

Such reset state can be released when the reset terminal 11 is turned to "0". At this time, the output of the AND gate circuit 8 turns to "0" as illustrated in $R_1$ of FIG. 2, releasing the reset state of dividing stage 2. Thereafter, when the output of the dividing stage 3 rises as illustrated in $F_2$ in FIG. 2, the flip-flop circuit 7 is triggered, resulting in the output $\bar{Q}$ changing to the "0" state and thereby switching gate 9 so that $R_2$ is "0" and the counting state of dividing stage 4 is released. As a result, the drive pulses $0_1$, and $0_2$ of FIG. 2 are generated from the drive circuit 5 alternately every other one second.

Figure 3:
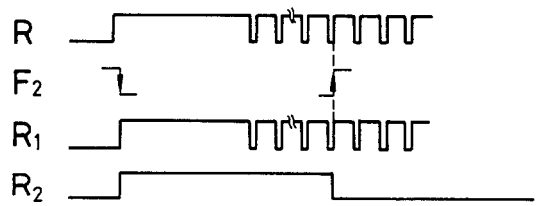
Figure 4:
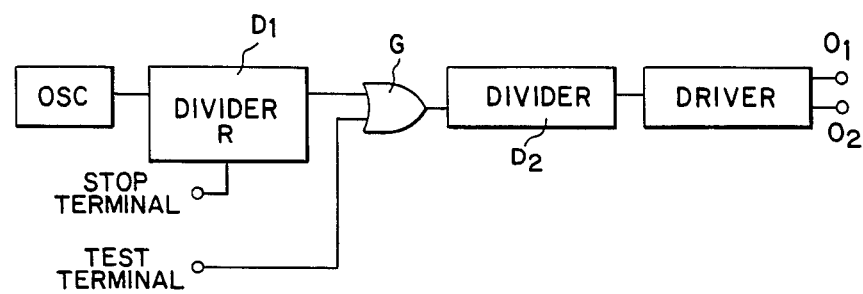
FIG. 4 is a circuit diagram of a prior art test circuit

The test operation is now explained. In this case, the reset terminal 11 is once again set to "1" for attaining the reset state as described previously. Thereafter, a high test clock pulse is externally input as shown in R of FIG. 3, to the reset terminal 11. The pulse width of the "0" portion of such clock pulse is set to be shorter than ½ the width of output pulse sent from the frequency dividing stage 2. This clock pulse continues to reset the dividing stage 2. Since the pulse width of said clock pulse is set shorter than ½ the width of the output pulse from the dividing stage 2, the frequency dividing stage 2 is reset before the generation of output in spite of the period of this clock pulse and the output $F_1$ does not provide a pulse to NOR gate 10. Gate 10 passes test clock pulses $R_1$ to dividing stage 3.

The test clock pulse is level-inverted by the gate circuit 10 and is then supplied to the frequency dividing stage 3, causing it to operate at the falling edge. When said clock pulses are supplied in a specified number, the output of the dividing stage 3 rises as shown in $F_2$ of FIG. 3 and the flip-flop circuit 7 is triggered inverting the output $\bar{Q}$ to "0". Accordingly, the output of the gate circuit 9 is inverted to "0" like R in FIG. 3 and the reset state of dividing stage 4 is released. The frequency dividing stages 3, 4 are thus operated at a high speed by said test clock pulse and are tested by the output of drive circuit 5.

Here, the flip-flop circuit 6 is triggered by the falling edge of pulse sent from the frequency dividing stage 3, but the D input thereof is synchronized with the output pulse of dividing stage 3. Therefore, the D input of the flip-flop circuit 6 is certainly set to "1" when the output pulse of dividing stage 3 falls. Accordingly, output Q of flip-flop circuit 6 is kept at "1".

The present invention can be applied to a device providing a frequency dividing circuit which divides a standard reference frequency, as well as to an integrated circuit for a clock.

According to the present invention, the test of frequency dividing stages can be carried out by supplying external clock pulses to only one terminal. Therefore, the chip area of an integrated circuit can be made small and a cost reduction can be realized. Moreover, since the clock pulses for the test are supplied to the intermediate stage of a frequency dividing circuit, the test period can be curtailed and in this sense the present invention is more effective when it is applied to the test of a large amount of integrated circuits.

Further, a reset terminal is used as the test terminal, and it is no longer necessary to provide a separate test terminal.

I claim:

1. An integrated circuit with a frequency dividing test function, comprising: a first frequency dividing circuit which divides a given frequency signal and produces a first output signal at a divided frequency, a second frequency dividing circuit for dividing the output signal from said first frequency dividing circuit, a single terminal receptive of external test clock pulses, and a test circuit connected to the terminal including means for inhibiting the output signal from said first frequency dividing circuit to said second frequency dividing circuit in response to external test clock pulses applied to said terminal and having a higher frequency than the divided frequency of the first output signal and for simultaneously applying the external clock pulses to said second frequency dividing circuit to test said second frequency dividing circuit.

2. An integrated circuit with a frequency dividing test function, comprising: a first frequency dividing circuit which divides a given standard frequency signal and produces a first output signal at a divided frequency, a second frequency dividing circuit which divides the output signal from said first frequency dividing circuit, a reset terminal receptive of a reset signal, a reset and test circuit connected to the reset terminal including means receptive of a given voltage level or test clock pulses externally applied to said reset terminal for resetting said first frequency dividing cicuit and simultaneously supplying said external to test said second frequency dividing circuit.

3. The circuit according to claim 4, wherein the reset and test circuit includes means for resetting the first dividing circuit in response to clock pulses having a higher frequency than the divided frequency.

* * * * *